United States Patent
Wang et al.

(10) Patent No.: US 10,840,624 B2
(45) Date of Patent: Nov. 17, 2020

(54) NGSFF AND M.2 DIFFERENTIATION AND MUTUAL PROTECTION CIRCUIT

(71) Applicant: Samsung Electronics Co., Ltd., Suwon-si (KR)

(72) Inventors: David T. Wang, San Carlos, CA (US); Gwangman Lim, Seoul (KR); Shinwoo Park, Suwon-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 57 days.

(21) Appl. No.: 15/989,056

(22) Filed: May 24, 2018

(65) Prior Publication Data
US 2019/0245291 A1 Aug. 8, 2019

Related U.S. Application Data

(60) Provisional application No. 62/627,646, filed on Feb. 7, 2018.

(51) Int. Cl.
*H01R 12/73* (2011.01)
*G11C 5/14* (2006.01)
(Continued)

(52) U.S. Cl.
CPC ............ *H01R 12/73* (2013.01); *G11C 5/14* (2013.01); *G11C 16/30* (2013.01); *H01R 13/6683* (2013.01)

(58) Field of Classification Search
CPC ...... H01R 12/73; H01R 12/777; H01R 12/78; H01R 12/79; H01R 13/6616;
(Continued)

(56) References Cited

U.S. PATENT DOCUMENTS 9,021,159 B2   4/2015  Fritchman et al.
9,619,164 B2   4/2017  Mehta et al.
(Continued)

FOREIGN PATENT DOCUMENTS

JP     2016076000 A     5/2016

OTHER PUBLICATIONS

Wang, David, "Next Generation Small Form Factor (NGSFF) SSD Proposal", Flash Memory Summit 2017 Proceedings (Aug. 10, 2017), Santa Clara, CA.

*Primary Examiner* — Edwin A. Leon
*Assistant Examiner* — Milagros Jeancharles
(74) *Attorney, Agent, or Firm* — Renaissance IP Law Group LLP

(57) ABSTRACT

A device includes a connector and a detector device. The connector includes at least one first-type pin and at least one second-type pin. The connector is capable of being connected to a corresponding connector of a solid-state drive (SSD) device. The detector device controls the at least one first-type pin to be coupled to a first power supply voltage based on, at least in part, the at least one second-type pin is connected to a second power supply voltage while the corresponding connector of the SSD device is connected to the first connector. If the at least one second-type pin is detected as being connected to a third power supply voltage different from the second power supply voltage while the corresponding connector of the SSD device is connected to the first connector, the detector device controls the at least one first-type pin to be in a non-connected state.

20 Claims, 9 Drawing Sheets

(51) Int. Cl.
*G11C 16/30* (2006.01)
*H01R 13/66* (2006.01)

(58) Field of Classification Search
CPC ............ H01R 13/6666; H01R 13/6675; H01R 13/6683; H01R 13/465; H01R 13/641; H01R 13/64; H01R 13/6272; H01R 13/639; G11C 5/14; G11C 16/30
See application file for complete search history.

(56) References Cited

U.S. PATENT DOCUMENTS

| | | |
|---|---|---|
| 2009/0020608 A1 | 1/2009 | Bennett et al. |
| 2011/0133943 A1* | 6/2011 | Kouyama ............ G01R 31/045 340/635 |
| 2011/0170577 A1 | 7/2011 | Knvari |
| 2014/0070791 A1 | 3/2014 | Funakoshi |
| 2014/0184162 A1* | 7/2014 | Takahashi ............ H02J 7/0069 320/128 |
| 2014/0372666 A1 | 12/2014 | Moioli et al. |
| 2016/0364360 A1* | 12/2016 | Lim .................... G06F 13/4282 |
| 2017/0005447 A1* | 1/2017 | Kim .................... H01R 13/6616 |
| 2017/0033513 A1* | 2/2017 | Bae ...................... H01R 31/065 |
| 2017/0109174 A1 | 4/2017 | Desimone et al. |
| 2017/0220090 A1* | 8/2017 | Kim .......................... G06F 1/10 |
| 2017/0264060 A1 | 9/2017 | Kimura |
| 2017/0346240 A1* | 11/2017 | Oporta .................. G06F 13/385 |
| 2018/0062325 A1* | 3/2018 | Kim .................... H01R 13/6675 |
| 2018/0224912 A1* | 8/2018 | Wang .................. G06F 13/4282 |
| 2018/0239696 A1* | 8/2018 | Lim ..................... G06F 13/387 |

\* cited by examiner

| Pin | Signal | Signal | Pin |
|---|---|---|---|
| | | GND | 75 |
| 74 | 3.3V | GND | 73 |
| 72 | 3.3V | GND | 71 |
| 70 | 3.3V | PEDET (NC-PCIe) | 69 |
| 68 | SUSCLK(32KHz) (I)(0/3.3V) | NC | 67 |
| | ADD_IN CARD KEY M | ADD_IN CARD KEY M | |
| | ADD_IN CARD KEY M | ADD_IN CARD KEY M | |
| | ADD_IN CARD KEY M | ADD_IN CARD KEY M | |
| | ADD_IN CARD KEY M | ADD_IN CARD KEY M | |
| 58 | Reserved for MFG_CLOCK | GND | 57 |
| 56 | Reserved for MFG_DATA | REFCLKp | 55 |
| 54 | PEWAKE# (I/O)(0/3.3V) | REFCLKn | 53 |
| 52 | CLKREQ# (I/O)(0/3.3V) | GND | 51 |
| 50 | PERST#(I)(0/3.3V) | PERp0 | 49 |
| 48 | NC | PERn0 | 47 |
| 46 | NC | GND | 45 |
| 44 | ALERT#(O)(0/1.8V) | PETp0 | 43 |
| 42 | SMB_DATA (I/O)(0/1.8V) | PETn0 | 41 |
| 40 | SMB_CLK (I/O)(0/1.8V) | GND | 39 |
| 38 | DEVSLP (I), SATA | PERp1 | 37 |
| 36 | NC | PERn1 | 35 |
| 34 | NC | GND | 33 |
| 32 | NC | PETp1 | 31 |
| 30 | NC | PETn1 | 29 |
| 28 | NC | GND | 27 |
| 26 | NC | PERp2 | 25 |
| 24 | NC | PERn2 | 23 |
| 22 | NC | GND | 21 |
| 20 | NC | PETp2 | 19 |
| 18 | 3.3V | PETn2 | 17 |
| 16 | 3.3V | GND | 15 |
| 14 | 3.3V | PERp3 | 13 |
| 12 | 3.3V | PERn3 | 11 |
| 10 | LED_1#(0)/DAS/DSS (I/O) | GND | 9 |
| 8 | NC | PETp3 | 7 |
| 6 | NC | PETn3 | 5 |
| 4 | 3.3V | GND | 3 |
| 2 | 3.3V | GND | 1 |

FIG. 5

NGSFF AND M.2 DIFFERENTIATION AND MUTUAL PROTECTION CIRCUIT

CROSS-REFERENCE TO RELATED APPLICATION

This patent application claims the priority benefit under 35 U.S.C. § 119(e) of U.S. Provisional Patent Application No. 62/627,646, filed on Feb. 7, 2018, the disclosure of which is incorporated herein by reference in its entirety.

TECHNICAL FIELD

The subject matter disclosed herein generally relates to form factors for solid-state drives (SSDs), and more particularly, a form factor for host and client devices that may conform to different interface standards.

BACKGROUND

The form factor for the M.2 interface standard used by SSD devices has been a successful form factor in which hundreds of millions of SSD devices conforming to the M.2 form factor are in use, and in which annual shipment volumes are in the hundreds of millions.

SUMMARY

An example embodiment provides a device that may include a first connector and at least one first detector device. The first connector may include at least one first-type pin and at least one second-type pin in which the first connector may be capable of being connected to a corresponding connector of an SSD device. The at least one first detector device may be coupled to the at least one first-type pin of the first connector. The at least one first detector device may control the at least one first-type pin to be coupled to a first power supply voltage based on, at least in part, detecting that the at least one second-type pin is connected to a second power supply voltage while the corresponding connector of the SSD device is connected to the first connector. The at least one first detector device may also control the at least one first-type pin to be in a non-connected state based on, at least in part, detecting that the at least one second-type pin is connected to a third power supply voltage while the corresponding connector of the SSD device is connected to the first connector. In one embodiment, the first connector may have an M.2 form factor in which at least one first-type pin of the first connector may be at least one of a pin 30, pin 32, pin 34 and pin 36 of the first connector, and the at least one second-type pin of the first connector may be at least one of pin 2, pin 4, pin 72 and pin 74 of the first connector.

Another example embodiment provides an SSD device that may include a first connector and at least one first detector device. The first connector may include at least one first-type pin and at least one second-type pin in which the first connector may be capable of being connected to a corresponding connector of a host device. The at least one first detector device may be coupled to the at least one first-type pin and the at least one second-type pin of the first connector. The at least one first detector device may control the at least one first-type pin of the first connector to be coupled to a first voltage based on, at least in part, detecting that the at least one second-type pin of the first connector is connected to a second voltage while the SSD is connected to the corresponding connector of the host device in which the first voltage may be provided by the host device. The at least one first detector device may also control the at least one first-type pin of the first connector to be in a non-connected state based on, at least in part, detecting that the at least one second-type pin of the first connector is connected to a third voltage while the first connector is connected to the corresponding connector of the host device. In one embodiment, the first voltage may be 12 V, the second voltage may be ground, and the third voltage may be 3.3 V.

Still another example embodiment provides an SSD device may include a first connector and at least one first detector device. The first connector may include at least one first-type pin and at least one strap-signal-type pin, and the first connector may be capable of being connected to a corresponding connector of a host device. The at least one first detector device may be coupled to the at least one first-type pin and the at least one strap-signal-type pin of the first connector. The at least one detector device may control each first-type pin of the first connector to be coupled to a first voltage based on, at least in part, detecting that the at least one strap-signal-type pin of the first connector is connected to a second voltage while the first connector is connected to the corresponding connector of the host device in which the first voltage may be provided by the host device. The at least one detector device may also control each first-type pin of the first connector to be in a non-connected state based on, at least in part, detecting that the at least one strap-signal-type pin of the first connector is connected to a third voltage while the first connector is connected to the corresponding connector of the host device. In one embodiment, the first connector may have an M.2 form factor in which the at least one first-type pin of the first connector may include at least one of a pin 30, pin 32, pin 34 and pin 36 of the first connector, the at least one strap-signal-type pin of the first connector may include at least one of pin 2, pin 4, pin 72 and pin 74 of the first connector, and the first voltage may be 12 V, the second voltage may be ground, and the third voltage may be 3.3 V.

BRIEF DESCRIPTION OF THE DRAWINGS

In the following section, the aspects of the subject matter disclosed herein will be described with reference to exemplary embodiments illustrated in the figures, in which:

FIG. 5 depicts a pin out diagram of a connector conforming to a current M.2 interface standard;

DETAILED DESCRIPTION

Figure 1:
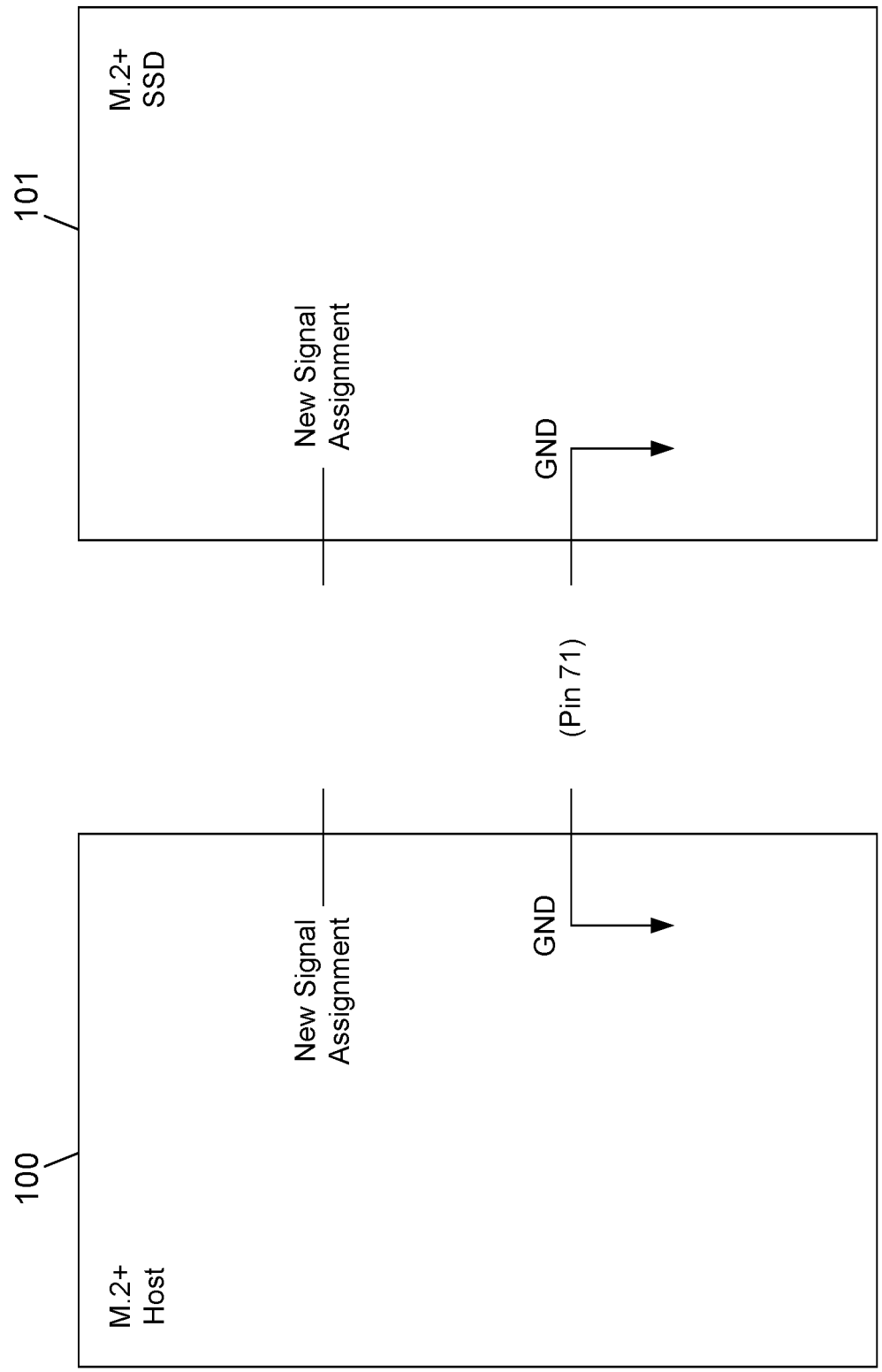
FIG. 1 depicts a block diagram of an M.2+ host and an M.2+ SSD device in a connective relationship.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to avoid obscuring the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein provides a system that utilizes the form factor of the connector of a standardized interface and so that devices conforming to different interface standards and using mating versions of the form-factor connector may be connected to each other without damaging the respective devices and while still providing functionality. Additionally, the subject matter disclosed herein provides that devices conforming to different interface standards and using mating versions of the form-factor connector may be reliably detected and differentiated so that devices having a future expansion functionalities may be connected together without causing serious damage. That is, the subject matter disclosed herein provides system that includes a reliable detection and differentiation capability for distinguishing devices utilizing the form factor of a standardized interface.

The subject matter disclosed herein provides that different client-type devices having different functionalities may be connected to different host devices to the advantage and benefit of a system management entity of a host device system. That is, a homogeneous group of a plurality of host devices may be connected to client-type devices that may conform to different interface standards without incurring a cost to replace some or all of the host devices in order to have host and client-type devices that match at the interface standard level. Similarly, a homogeneous group of client-type devices that may conform to a given interface standard may be connected to a heterogeneous group of host devices that may conform to different interface standards. Thus, both system operators and device manufacturers may benefit from the features provided by the subject matter disclosed herein.

In one embodiment, the subject matter disclosed herein provides a client-type device, such as an SSD device, having an M.2 form factor while providing a functionality/capability that may not conform to a functionality/capability associated with an M.2 interface standard. In one embodiment, a New Generation Small Form Factor (NGSFF) SSD device may include a form factor that conforms to the M.2 form factor, and that is able to provide an expanded capability/functionality that may be different from the M.2 interface standard. Such an NGSFF client device may be connected to a host device that conforms to the M.2 interface standard without damaging the host device or the M.2 SSD device.

In one embodiment, an NGSFF SSD device may include a detector device that reliably senses or detects that a connection has been made to an M.2 host device and prevents damage to both the M.2 host device and the NGSFF SSD device. The M.2 host device remains capable of providing M.2 interface standard functionality regardless whether an NGSFF SSD device or an M.2 SSD device is connected to the M.2 host device.

Additionally, the subject matter disclosed herein provides an NGSFF host device that conforms to the M.2 form factor and may be connected to an M.2 SSD device without damage to NGSFF host device or to the M.2 SSD device. In one embodiment, the NGSFF host device may include a detector device that reliably senses or detects that a connection has been made to an M.2 SSD device and prevents damage to both the NGSFF host device and the M.2 SSD device. The NGSFF host device remains capable of providing NGSFF functionality regardless whether an M.2 SSD device or an NGSFF SSD device is connected to the NGSFF host device. If an M.2 SSD device is connected to the NGSFF host device, the M.2 SSD device may provide functionality corresponding to the M.2 functionality while being connected to the NGSFF host device.

The subject matter disclosed herein also provides connective protection for an M.2 host device that provides a future/expansion M.2 functionality (herein referred to as an M.2+ host) if an NGSFF SSD device is connected to the M.2+ host device. Similarly, the subject matter disclosed herein provides connective protection for an NGSFF host device that provides a future/expansion NGSFF functionality (herein referred to as an NGSFF+ host) if an M.2 SSD device is connected to the NGSFF+ host device. That is, the sensor devices disclosed herein provide a reliable system for detecting and distinguishing the respective functionalities of the host and SSD devices.

As used herein the term "M.2" refers to a current version of the M.2 SSD interface standard. As used herein, the term "M.2+" refers to a future version of the M.2 SSD interface standard having expanded functionality with respect to the current version of the M.2 SSD interface standard. As used herein, the term "NGSFF" refers to a current version of the NGSFF SSD interface standard. As used herein, the term "NGSFF+ " refers to a future version of the NGSFF SSD interface standard having expanded functionality with respect to the current version of the NGSFF SSD interface standard. As used herein, the terms "M.2" and "M.2+" may be understood as being interchangeable. Additionally, as used herein, the terms "NGSFF" and "NGSFF+ " may be understood as being interchangeable.

Thus, the subject matter disclosed herein provides that an M.2 host device, regardless whether it is an M.2 or an M.2+ host device, may be connected to an NGSFF or an NGSFF+ SSD device, and neither the host device nor the SSD device may be damaged. Likewise, the subject matter disclosed herein provides that an NGSFF host device, regardless whether it is an NGSFF or an NGSFF+ host device, may be connected to an M.2 or an M.2+ SSD device, and neither the host device nor the SSD device may be damaged.

In one embodiment, the form factor of an M.2 interface may be configured to provide the functionality associated with the M.2 interface standard and/or an NGSFF standard without damaging a device conforming to either interface standard. Legacy M.2 devices, regardless whether a host/client device, are able to continue to provide the legacy functionality while being connected to an NGSFF client/host device. An M.2+ device having a future-expansion functionality may be connected to an NGSFF device without damage, although the expanded functionality of the M.2+ device may not be available through the NGSFF device. Similarly, an NGSFF+ device having a future-expansion functionality may be connected to an M.2 device without damage, although the expanded functionality of the NGSFF+ device may not be available through the M.2 device.

The subject matter disclosed herein leverages the advantages and benefits provided by the form factor for the M.2 interface standard. That is, the subject matter disclosed herein is leveraging the rich ecosystem established by the form factor of the M.2 interface standard for SSDs in terms of lower costs and a faster time-to-market that may be provided by the M.2 interface standard. To leverage the M.2 ecosystem, the NGSFF form factor disclosed herein utilizes the same form factor and the same socket interface as an M.2 connector. In contrast to the M.2 interface standard, the signal assignment for an NGSFF SSD connector includes a new high-voltage 12 V supply rail that has been added to previously reserved pins on the M.2 interface. Accordingly, the signal assignments for an NGSFF SSD interface have been selected to avoid conflicts with M.2 SSD signal assignments, thereby enabling both M.2 and NGSFF SSD devices to share the same socket interface.

An issue relating to the NGSFF SSD interface standard and the M.2 SSD interface standard is that the two interface standards are controlled by two different standards-setting bodies. In particular, the NGSFF SSD interface standard is standardized by the Joint Electron Device Engineering Council (JEDEC), whereas the M.2 SSD interface standard is standardized by the Peripheral Component Interconnect Special Interest Group (PCI SIG). So, NGSFF SSD signal assignments have been selected to avoid conflicts with existing M.2 SSD signal assignments. Nevertheless, the PCI SIG may accept possible extensions of the functionality and capability of the M.2 SSD interface standard in the future with new signals assigned to the previously reserved pins on the M.2 SSD interface. Consequently, the NGSFF SSD signal assignments that have assigned high-voltage 12 V supply rails to the M.2 reserved pins of the M.2 SSD interface may cause conflicts for future M.2 interface expansions.

Given that M.2 SSD signal assignments are controlled by the PCI SIG, and the PCI SIG may re-map all of the reserve signals on the M.2 socket interface to new features and functions, the subject matter disclosed herein provides a system that reliably detects and differentiates NGSFF SSD devices from M.2 SSD devices so that NGSFF and future M.2 SSDs having different signal and supply voltages do not conflict with each other.

Table 1 below sets for potential conflicts that may arise between current and future M.2 host devices and current and future M.2 SSD devices and current NGSFF SSD devices. Additionally, Table 1 sets for potential conflicts that may arise between a current NGSFF host device and current and future M.2 SSD devices and current NGSFF SSD devices.

TABLE 1

Potential Conflicts with Future M.2 Expansions

|  | Current M.2 SSD Device | M.2+ SSD Device | NGSFF SSD Device |
| --- | --- | --- | --- |
| Current M.2 Host | Works | Works, but does not use new features | Does not work. Device does not turn on. |
| M.2+ Host | Works, but does not use new features | Works | Does not work. Potentially damages host and/or device. |
| NGSFF Host | Does not work. Device does not turn on. | Does not work. Potentially damages host and/or device. | Works |

Referring to the first row of Table 1, if a current M.2 SSD device is connected to a current M.2 host, both the M.2 SSD device and the M.2 host will operate correctly. If an M.2+ SSD device in connected to a current M.2 host, both devices will operate, but any new features associated with the M.2+ SSD device will not be available through the current M.2 host. If a current NGSFF SSD device is connected to a current M.2 host, the NGSFF SSD device will not work because the NGSFF SSD device will not turn on.

Referring to the second row of Table 1, if a current M.2 SSD device is connected to an M.2+ host, the M.2 SSD device will operate, but any new features associated with the M.2+ host will not be available through the current M.2 SSD device. If an M.2+ SSD device is connected to an M.2+ host, the M.2+ SSD device will operation and any new features associated with the M.2+ host and SSD device will be available. If a current NGSFF SSD device is connected to an M.2+ host, the NGSFF SSD device will not operate and the M.2+ host and/or the NGSFF SSD device may be damaged.

Referring to the third row of Table 1, if a current M.2 SSD device is connected to a current NGSFF host, the M.2 SSD device will not work because the M.2 SSD device will not turn on. If an M.2+ SSD device is connected to an NGSFF host, the M.2+ SSD device will not operate and the NGSFF host and/or the M.2+ SSD device may be damaged. If a current NGSFF SSD device is connected to a current NGSFF host, the NGSFF SSD device will operate.

The conflicting situations identified in Table 1 that are addressed by the subject matter disclosed herein may be situations in which (1) an NGSFF SSD device is intentionally or unintentionally connected to an M.2 or an M.2+ host; and (2) an M.2 or an M.2+ SSD device is intentionally or unintentionally connected to an NGSFF host. Two additional conflicting situations that should be included to further account for the conflicting situations in Table 1 are (3) an NGSFF+ SSD device is intentionally or unintentionally connected to an M.2 or an M.2+ host; and (4) an M.2 or an M.2+ SSD device is intentionally or unintentionally connected to an NGSFF+ host.

By the subject matter disclosed herein addressing the conflicting situations, SSD device manufacturers may benefit by being able providing a familiar SSD device design having a relatively faster time to market than would be the case if SSD device manufacturers that would opt for a new SSD interface standard. Additionally, original equipment manufacturers (OEMs) may benefit by having a lower cost structure, and a larger number of SSD device suppliers would be available having a larger range of SSD capacity options available and a larger range of configuration options available. Connector manufacturers may benefit based on a familiarity of a baseline design that would enable a faster time to market. Lastly, the industry may benefit because of an available low-cost and high-volume infrastructure and a quick ramp up to a rich and robust ecosystem with a minimal transition risk.

The conflicting issues set forth in Table 1 are addressed by the subject matter disclosed herein by providing reliable detection and differentiation of host and SSD devices conforming to the M.2/M.2+ interface standard and the NGSFF/NGSFF+ interface standard, and mitigating any conflicts at the host and/or at the SSD device. In this regard, it is observed that for M.2+ hosts and M.2+ SSD devices to be backward compatible with current M.2 hosts and M.2 SSD devices, ground and VDD connections through the M.2 interface will not likely change. Thus, a reliable detection technique may be to detect or sense whether ground and/or VDD connections correspond to the M.2 interface standard.

FIG. 1 depicts a block diagram of an M.2+ host 100 and an M.2+ SSD device 101 in a connective relationship. Because both the host 100 and the SSD device 101 are M.2+ devices, new signal pins would have been assigned, of which only one representative New Signal Assignment has been indicated in FIG. 1. It should be noted that pin 71 of the M.2 (and M.2+) interface standard has been assigned to be a ground voltage rail or strap, which will likely be invariant across different versions of the M.2 interface standard. Accordingly, pin 71 may be reliably detected to be a ground voltage rail or strap, thereby indicating that a device having pin 71 connected to ground conforms to the M.2 or an M.2+ interface standard.

Figure 2:
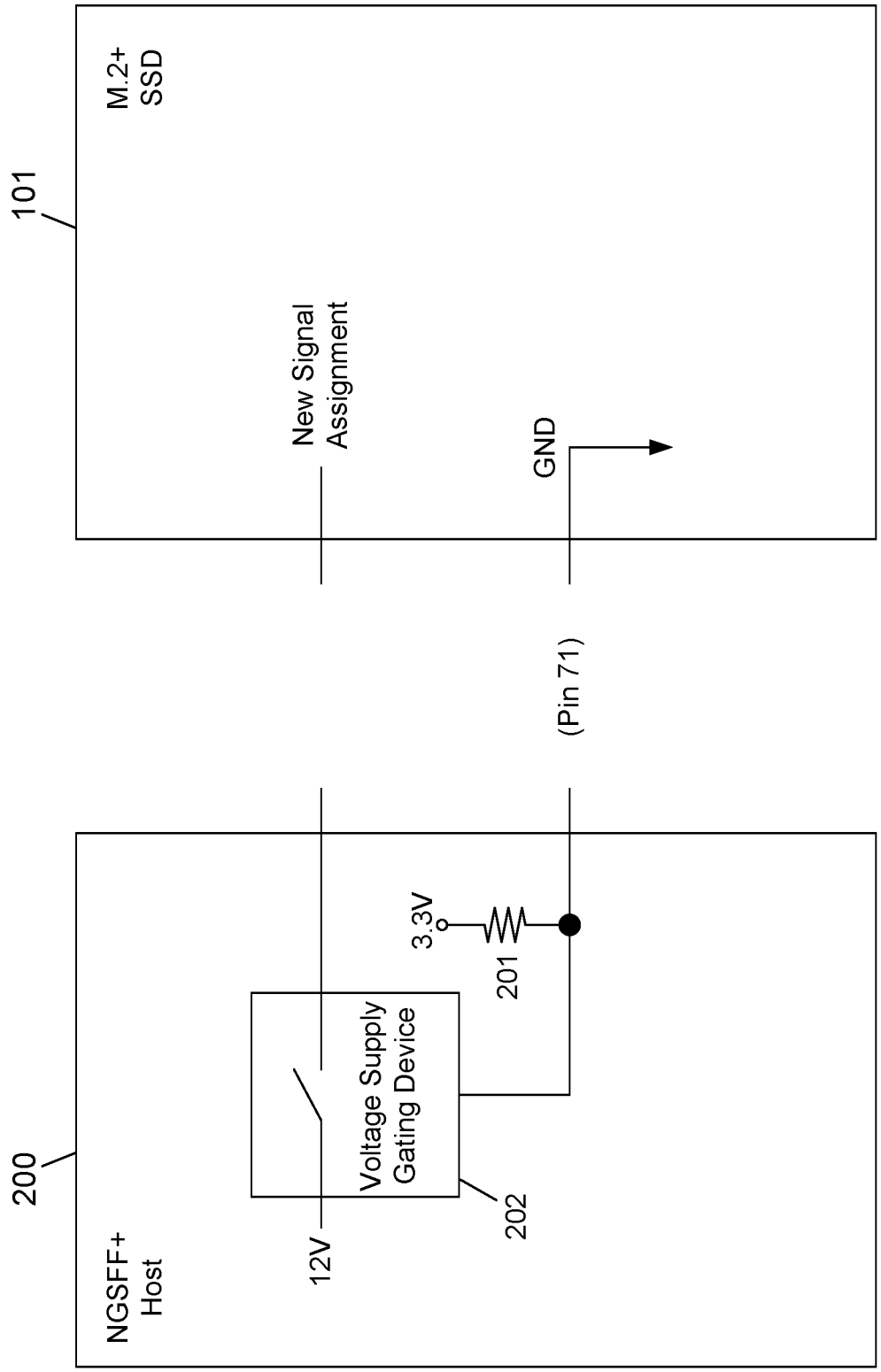
FIG. 2 depicts a block diagram of an NGSFF+ host and an M.2+ SSD device in a connective relationship.

FIG. 2 depicts a block diagram of an NGSFF+ host 200 and an M.2+ SSD device 101 in a connective relationship. The NGSFF+ host 200 may include a detection circuit that reliably detects whether an SSD device connected to the NGSFF+ host 200 conforms to the M.2 interface standard. To do this, the NGSFF+ host 200 may include a pull-up resistor 201 that may be connected between +3.3 V and pin 71 and a voltage supply gating device 202. The NGSFF+ host 200 also includes an electrical connection from pin 71 to one terminal of the pull-up resistor 201 and to a control input of the voltage supply gating device 202. The NGSFF+ host 200 may be configured to output, for example, +12 V power supply rail or strap on a pin that has been designated as reserved under the M.2 interface standard. If an M.2 or an M.2+ SSD device 101 is connected to the NGSFF+ host 200, the ground strap connection of the M.2 SSD device pulls pin 71 to ground, thereby controlling the voltage supply gating device 202 to open the connection between the +12 V power supply rail and the New Signal Assignment pin. Thus, the NGSFF+ host 200 is able to reliably detect that the M.2 SSD device 101 is an M.2 SSD device. Moreover, the voltage supply gating device 202 protects the M.2 SSD device 101 from damage by the +12 V power supply rail. Additionally, the detection function provided by the pull-up resistor 201 and the voltage supply gating device 202 may be used to gate other power supply voltage straps (not shown) and/or signals (not shown), thereby protecting an M.2 SSD device 101 that may be connected to the NGSFF+ host 200. Any future functionality associated with the M.2+ interface standard would not available if an M.2+ SSD device 101 is connected to the NGSFF+ host 200.

Figure 3:
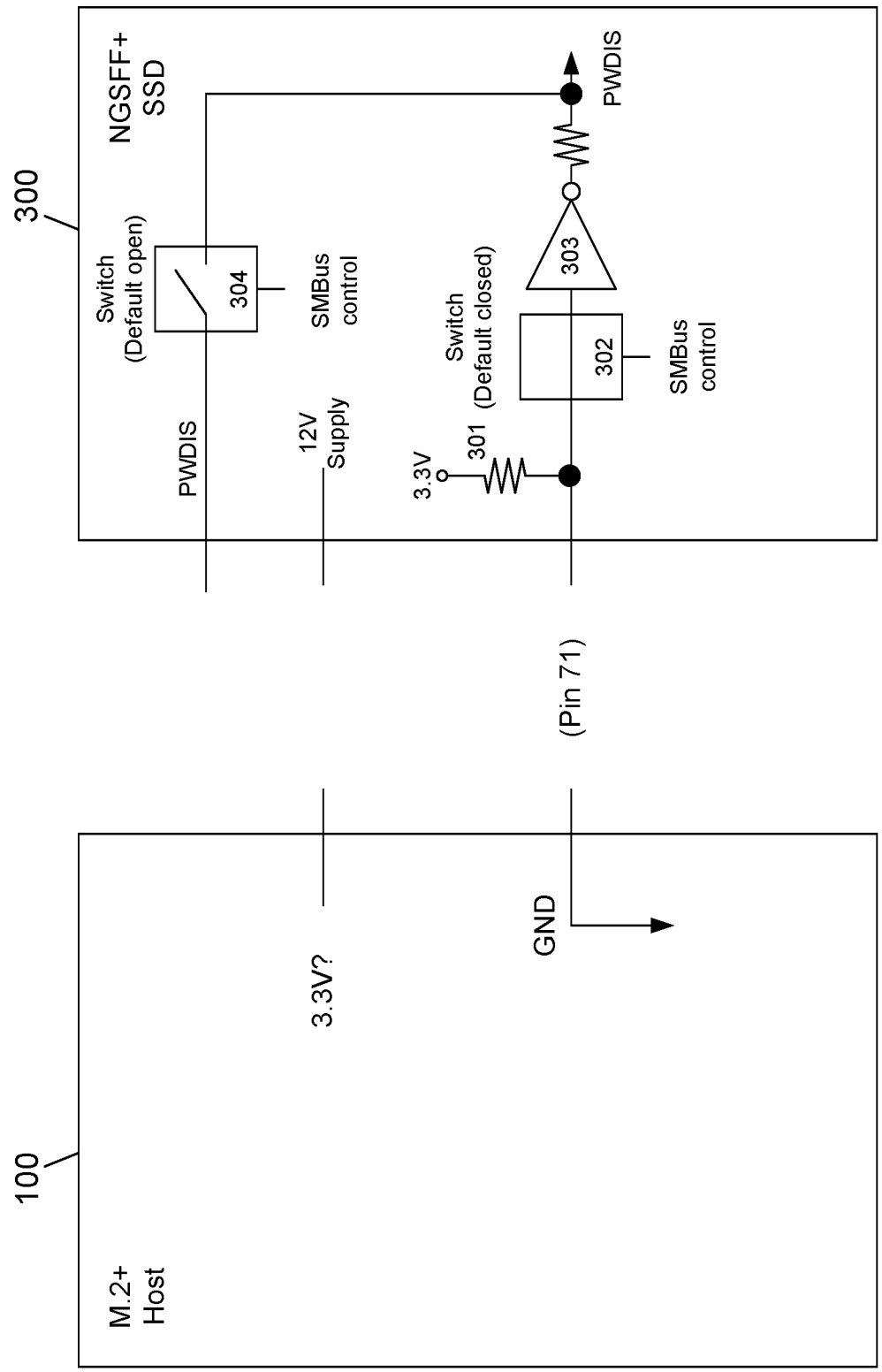
FIG. 3 depicts a block diagram of M.2+ host and an NGSFF+ SSD device in a connective relationship.

FIG. 3 depicts a block diagram of M.2+ host 100 and an NGSFF+ SSD device 300 in a connective relationship. The NGSFF+ SSD device 300 may include a detection circuit that reliably detects whether a host conforms to the M.2 interface standard. The NGSFF+ SSD device 300 may include a pull-up resistor 301 that may be connected between +3.3 V, pin 71 and an input to a first switch 302. The output of the switch 302 may be electrically connected through an inverter 303 and a second switch 304, then to a PWDIS pin of the NGSFF+ SSD device 300. In one embodiment, the first switch 302 may be a default-closed switch, and the second switch 304 may be a default-open switch. If the NGSFF+ SSD device 300 is connected to the M.2+ host 100, pin 71 will be connected to ground through the M.2+ host 100. The NGSFF+ SSD device 300 may also use a PWDIS signal, which would need to be added as a new signal for the NGSFF+ interface standard, to control the +3.3 V output from the M.2+ host 100, thereby preventing stray currents from being driven from the NGSFF+ SSD device 300 and protecting the M.2+ host 100. Other aspects regarding the connective relationship depicted in FIG. 3 that may need additional consideration may relate to whether a +12 V power supply rail is available from the M.2+ host 100, whether +3.3 V is being supplied from the M.2+ host 100 on a +12 V power supply rail, and/or whether a sequencing relationship between the PWDIS signal and the SMBus needs to be coordinated.

Figure 4:
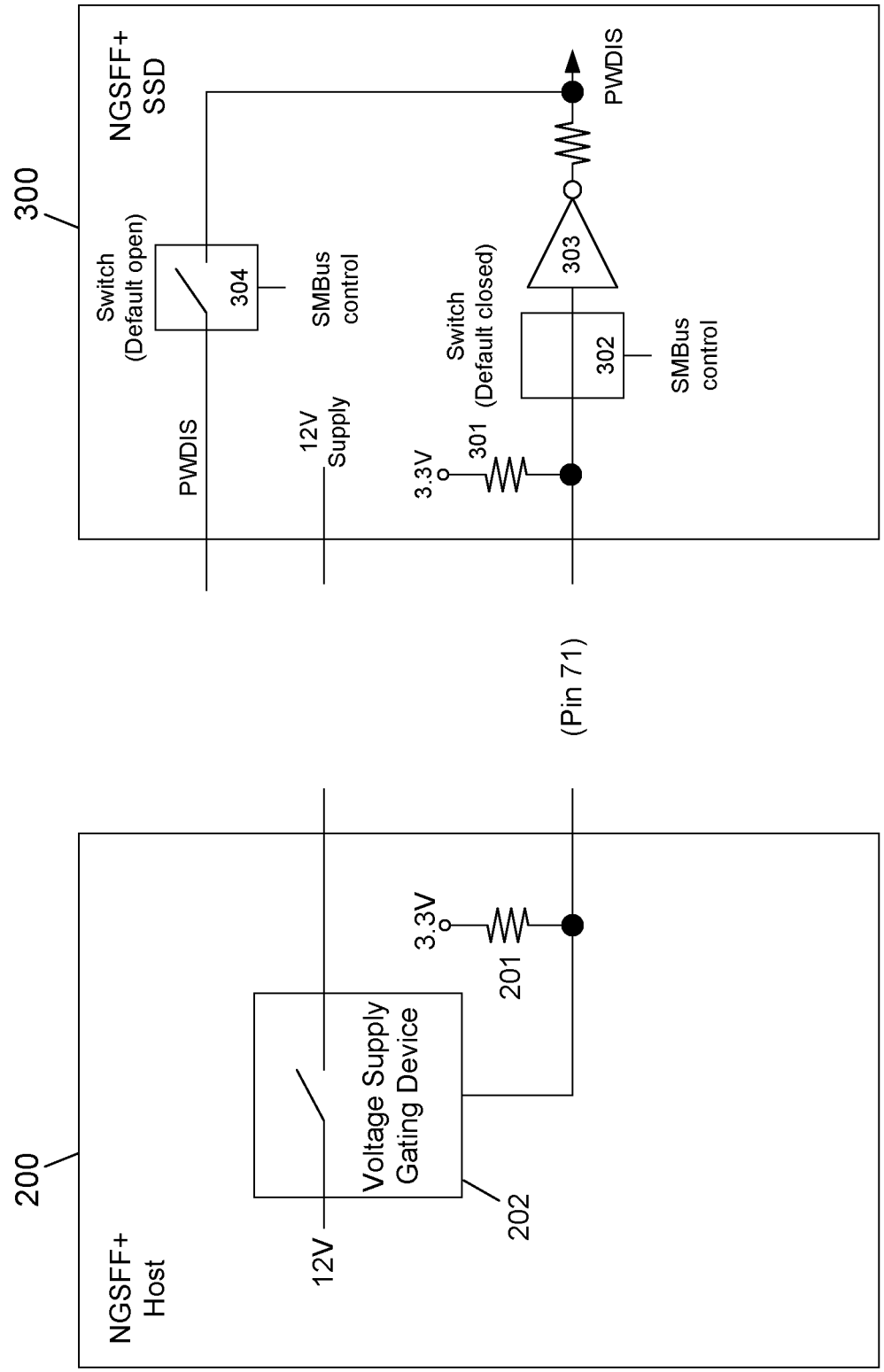
FIG. 4 depicts a block diagram of an NGSFF+ host and a NGSFF+ SSD device in a connective relationship.

FIG. 4 depicts a block diagram of an NGSFF+ host 200 and a NGSFF+ SSD device 300 in a connective relationship. It should be observed that the detection functionality of both the NGSFF+ host 200 and the NGSFF+ SSD device 300 detect or sense that the other device is not an M.2 device.

Although NGSFF devices support hot-plugging operations, M.2 devices do not, so considerations may still need to be addressed in relation to M.2+ devices that may support hot-plugging operations because detection and mitigation functions may lag application of +12 V. That is, +3.3 V would need to be provided in advance of +12 V being provided. Thus, hot-plugging operations involving both M.2 devices and NGSFF devices may possibly cause damage to a host and/or an SSD device. Nevertheless, because NGSFF devices support hot-plugging operations, +12 V power supply rails would likely operate normally.

FIG. 5 depicts a pin out diagram of a connector conforming to a current M.2 interface standard. It may be seen that pins 1, 3, 71, 73 and 75 are assigned as ground pins, pins 2, 4, 72 and 74 are assigned as 3.3 V pins, and pins 20-36 are assigned as no connection (NC) pins. Thus, a reliable detection of whether a host or an SSD device is an M.2 device may utilize pins 1, 3, 71, 73 and 75, and pins 2, 4, 72 and 74. Pins 20-36 may be utilized as +12 V for an NGSFF device.

Figure 6:
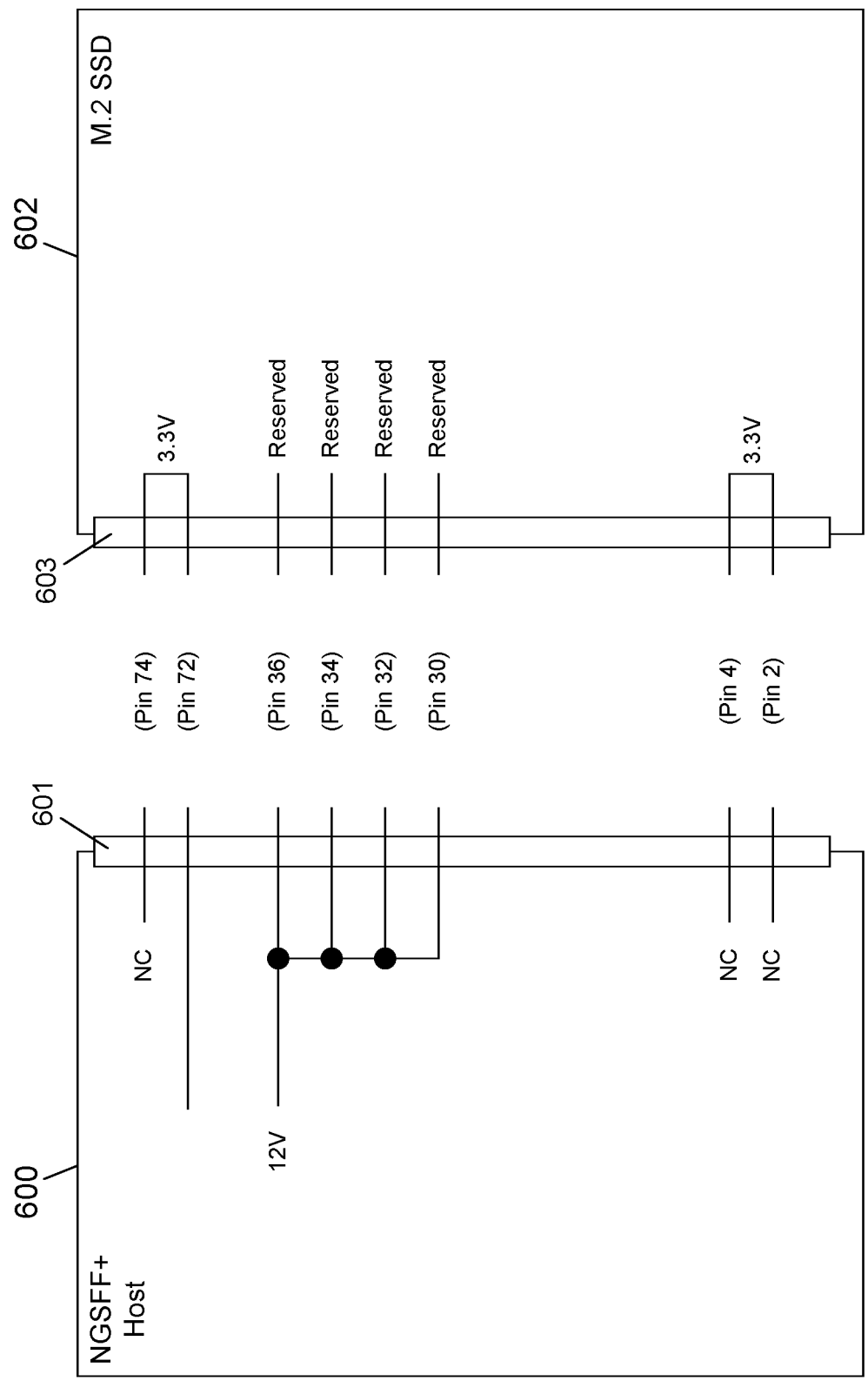
FIG. 6 depicts a block diagram of an NGSFF+ host and an M.2 SSD device in a connective relationship.

FIG. 6 depicts a block diagram of an NGSFF+ host 600 and an M.2 SSD device 602 in a connective relationship. As depicted in FIG. 6, the NGSFF+ host 600 includes a connector 601, and the M.2 SSD device 602 includes a connector 603. Existing NGSFF signal pin outs of the connector 601 have been assigned so that the NGSFF interface standard does not conflict with the current M.2 SSD signal mapping. Pins 2, 4, 72 and 74 have been assigned as NC by the NGSFF interface for an NGSFF host and for an NGSSF SSD device. Pins 30, 32, 34 and 36 have been assigned as 12 V VDD for an NGSFF host and a NGSFF SSD device. In contrast to the NGSFF pin assignments, pins 30, 32, 34 and 36 have been reserved signals (i.e., NC in FIG. 5) by the M.2 interface standard for an M.2 host and for an M.2 SSD device. Accordingly, as depicted in FIG. 6, if further M.2+ expansion signals are assigned to pins 30, 32, 34 and 36 for an M.2+ SSD and the M.2+ SSD is inserted into an NGSFF host, 12 V may be applied to signal pins of M.2+ SSD device and may damage both the NGSFF+ host and the M.2+ SSD device.

Thus, the subject matter disclosed herein relates to selecting a signal or a power supply rail that may be detected to reliably differentiate between two different sets of signal assignments (such as the NGSFF interface standard and the M.2 interface standard) in the absence of collaboration from the standards body that respectively control reserved signal assignments. According to the subject matter disclosed herein, a signal that may be used to reliably differentiate between the NGSFF interface standard and the M.2 interface standard is not selected from the pool of M.2 reserved pins. Instead, the subject matter disclosed herein takes advantage of the fact that the NGSFF interface standard utilizes 12 V VDD rather than 3.3 V VDD, and the 3.3 V VDD signals have been reassigned as NC by the NGSFF interface standard for SSDs with the understanding that PCISIG must also maintain compatibility between existing and future M.2 devices, and will likely not reassign the VDD or GND pins. Thus, the M.2 assigned 3.3 V VDD and GND pins provide implicit strap signals that may be selected as candidates to be used as reliable detection signals for differentiating between NGSFF devices and M.2 devices. Moreover, if redundant strap signals are selected at opposite ends of a connector, the detection system may become more reliable as a fail-safe detection technique.

Figure 7:
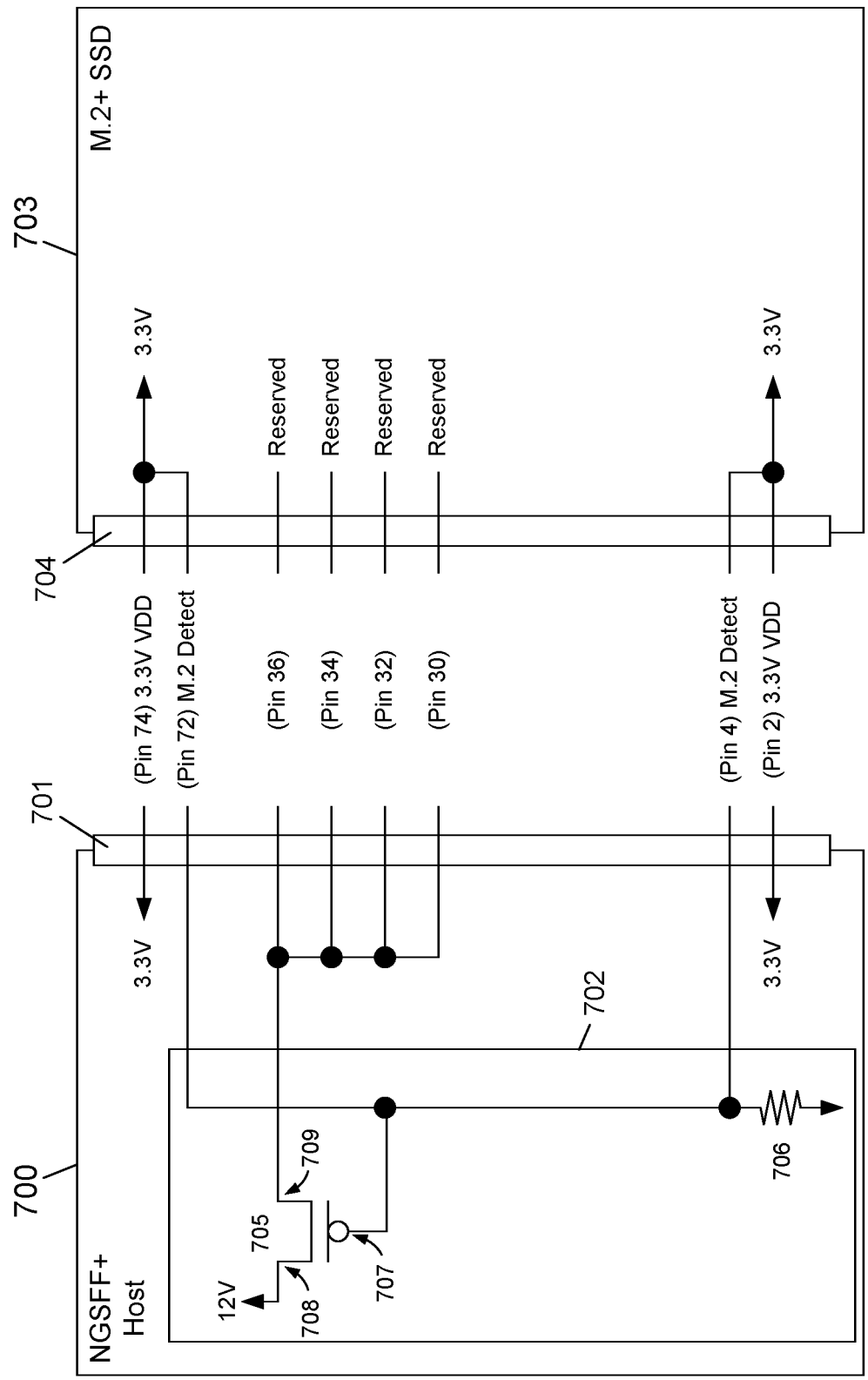
FIG. 7 depicts a schematic block diagram of an example embodiment of a NGSFF+ host device according to the subject matter disclosed herein.

FIG. 7 depicts a schematic block diagram of an example embodiment of a NGSFF+ host device 700 according to the subject matter disclosed herein. The NGSFF+ host device 700 may include a connector 701 and a detector device 702. The connector 701 may have a form factor that conforms to a published specification sheet or interface standard. In one embodiment, the connector 710 may conform to the form factor of an M.2 interface standard. The detector device 702 may sense or detect the electrical/functional compatibility of, for example, an SSD device 703 that is connected to the connector 701 and based on the detection, enable or disable signals/functionality provided by the host device 700. As importantly, the detector device 702 may control or gate the application of one or more power supply rail voltages to the SSD device 703 to prevent damage to the NGSFF+ host and/or an M.2+ SSD device.

In one embodiment, the connector 701 may have a form factor that conforms to, for example, an M.2 interface standard. In other embodiments, the host device 700 may be different from an NGSFF+ device and the connector 701 may have a form factor that conforms to an interface standard that is different from the M.2 interface standard.

The M.2+ SSD device 703 may include a connector 704 that has a form factor that conforms to a published specification sheet or interface standard. In one embodiment, the connector 704 may conform to the form factor of the M.2 interface standard. If, for example, the connector 704 of the M.2+ SSD device 703 conforms to a current version of the M.2 interface standard, pins 2, 4, 72 and 74 of the connector 704 are designated as +3.3 V, and pins 30, 32, 34 and 36 are designated as reserved (i.e., NC). As discussed, the reserve pins 30, 32, 34 and 36 of an M.2 connector might be used for future functionality and/or signal assignment. If the connector 704 conforms to a future version of the M.2 interface standard, then pins 30, 32, 34 and 36 may carry signals and/or voltages to provide the future function and/or signal assignment. The detector device 702 detects if the connector 704 conforms to the M.2 interface standard and prevents incorrect signals and/or voltages from being connected to pins 30, 32, 34 and 36, thereby preventing the M.2+ SSD device 703 and/or the host device 700 from being damaged.

The detector device 702 may include a switch device 705 and a resistive device 706 that sense or detect whether a SSD device 703 that is connected to the connector 701 is an M.2 device. A control terminal 707 of the switch device 705 may be electrically connected to one or both pins 4 and 72 of the connector 701. A second terminal 708 of the switch device 705 may be electrically coupled to, for example, a +12 V power supply rail, and a third terminal 709 of the switch device 705 is electrically connected to pins 30, 32, 34 and 36. The control terminal 707 may also be electrically coupled to one terminal of the resistive device 706. The other terminal of the resistive device 706 may be electrically coupled to ground.

Pin 2 and 74 of the host device 700 may be electrically connected to a +3.3 V supply. If the connector 704 of the SSD device 703 conforms to the electrical configuration of the M.2 interface standard, then pins 2, 4, 72 and 74 of the connector 704 will be connected together (i.e., shorted) internally in the M.2 SSD device 703. If the connector 704 is inserted into the connector 701, then the +3.3 V supplied to pins 2 and 74 of the connector 701 will be applied to pins 4 and 72 of the connector 701 through the connector 704 of the SSD device 703. If +3.3 V is applied (via pins 4 and 72 of the connector 701) to the control terminal 707 of the switch device 705, the switch device 705 does not conduct the +12 V power supply rail applied to the first terminal 708 to the second terminal 709 of the switch device 705, thereby isolating pins 30, 32, 34 and 36 of the connector 704 from the +12 V power supply voltage rail.

Any legacy functionality of the M.2 SSD device 103 is available to the host device 701 because the remainder of the pins of the connectors 701 and 704, and the legacy functionalities associated with those pins are still electrically/functionally compatible with each other.

Figure 8:
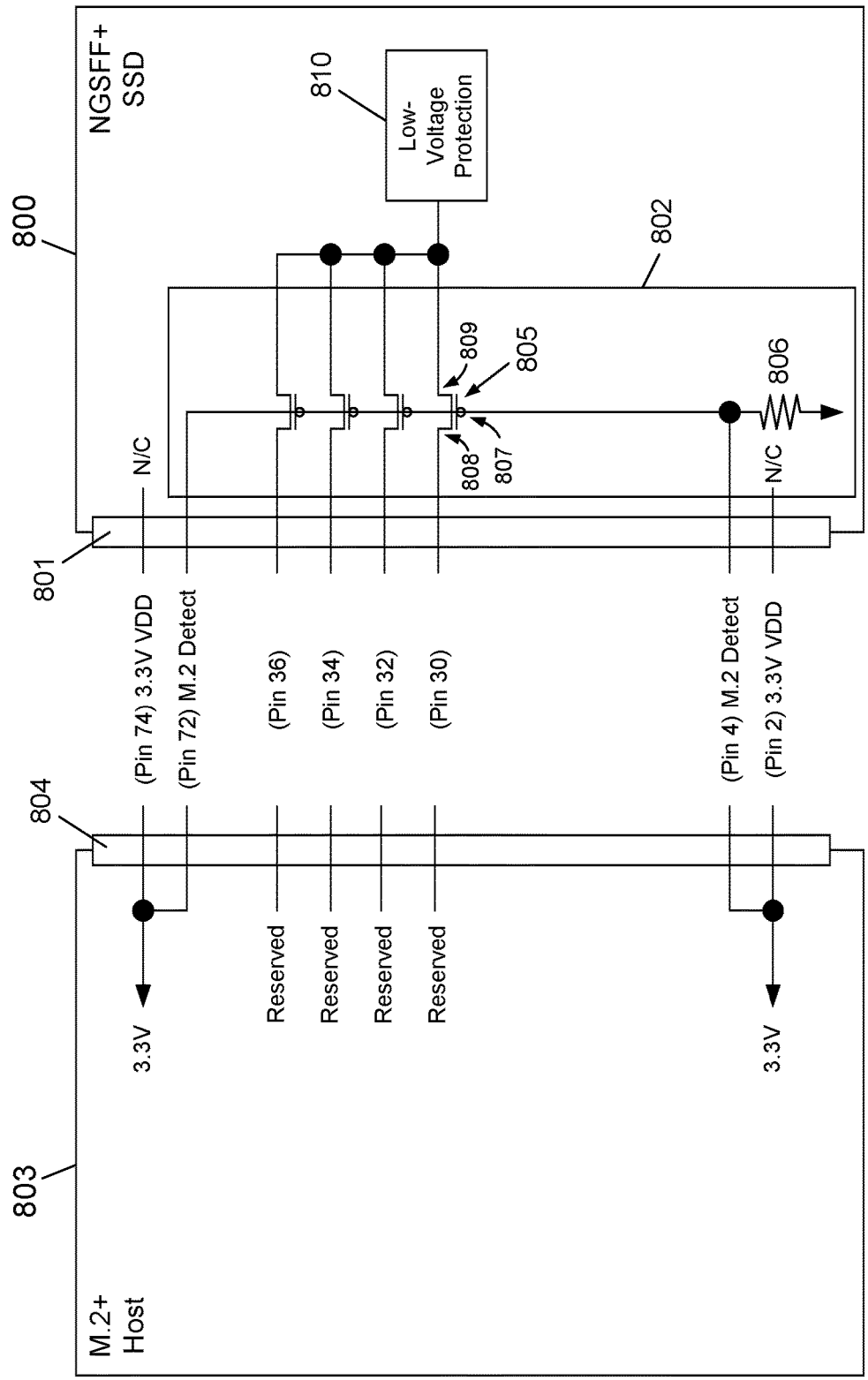
FIG. 8 depicts a schematic block diagram of an example embodiment of an NGSFF+ SSD device according to the subject matter disclosed herein.

FIG. 8 depicts a schematic block diagram of an example embodiment of an NGSFF+ SSD device 800 according to the subject matter disclosed herein. The NGSFF+ SSD device 800 may include a connector 801 and a detector device 802. The connector 801 may have a form factor that conforms to a published specification sheet or interface standard. In one embodiment, the interface standard may be the NGSFF interface standard. The connector 801 may be connected to a connector 804 of a host device 803, and the detector device 802 may sense or detect the electrical/functional compatibility of the NGSFF+ SSD device 800 with respect to a host device 803 while being connected to the host device 803. In particular, the detector device 802 may enable or disable functionality provided by the NGSFF+ SSD device 800 based on the sensed electrical/functional compatibility.

In one embodiment, the connector 801 may have a form factor that conforms with, for example, an M.2 interface standard. In other embodiments, the SSD device 800 may be different from an NGSFF+ SSD device and the connector 801 may have a form factor that conforms to an interface standard that is different from the M.2 interface standard.

The host device 803 may include a connector 804 that has a form factor that conforms to a published specification sheet or an interface standard. If, for example, the connector 804 of the host device 803 conforms to the M.2 interface standard, pins 2, 4, 72 and 74 of the connector 804 are designated as +3.3 V, and pins 30, 32, 34 and 36 are designated as reserved (i.e., NC). The reserve pins 30, 32, 34 and 36 of an M.2 connector might be used for future functionality. If the connector 804 conforms to a future version of the M.2 interface standard, then pins 30, 32, 34 and 36 may carry signals and/or voltages that provide the future function. The detector device 802 detects if the connector 804 conforms to the M.2 interface standard and prevents incorrect signals and/or voltages from being connected to pins 30, 32, 34 and 36, thereby preventing the NGSFF+ SSD device 800 and/or the host device 803 from being damaged.

The detector device 802 in FIG. 8 may include one or more switch devices 805, of which only one switch device is indicated, and a resistive device 806 that sense whether a host device 803 connected to the connector 801 is an M.2 host device. A control terminal 807 of each switch device 805 may be electrically connected to one or both pins 4 and 72 of the connector 801. A second terminal 808 of each switch device 805 may be electrically coupled to a respective pin 30, 32, 34 and 36 of the connector 801. A third terminal 809 of each switch device 805 is electrically connected to a low-voltage protection circuit 810 and/or other circuits on the SSD device 800 that are not shown. The control terminal 807 may also be electrically coupled to one terminal of the resistive device 806. The other terminal of the resistive device 806 may be electrically coupled to ground.

Pins 2, 4, 72 and 74 of the host device 803 may be electrically connected to a +3.3 V supply voltage rail because the connector 804 conforms to a published interface standard, such as the M.2 interface standard. If the connector 801 of the SSD device 800 does not conform to the electrical configuration of the M.2 interface standard, then pins 2 and 74 of the connector 201 do not connect to anything in the SSD device 800. Pins 4 and 72 of the connector 801 will be connected to +3.3 V power supply voltage rail output from the host device 803, and the +3.3 V will be applied to the control terminals 807 of the switching devices 805, thereby isolating pins 30, 32, 34 and 36 of the connector 801 from the low-voltage protection circuit 810.

Any expansion or future functionality available through pins 30, 32, 34 and 36 of the connector 804 of the host device 803 will not be available to the NGSFF SSD device 800. Any legacy functionality that would be available through the remaining pins of the connectors 801 and 804 would still be available to the SSD device 800.

Figure 9:
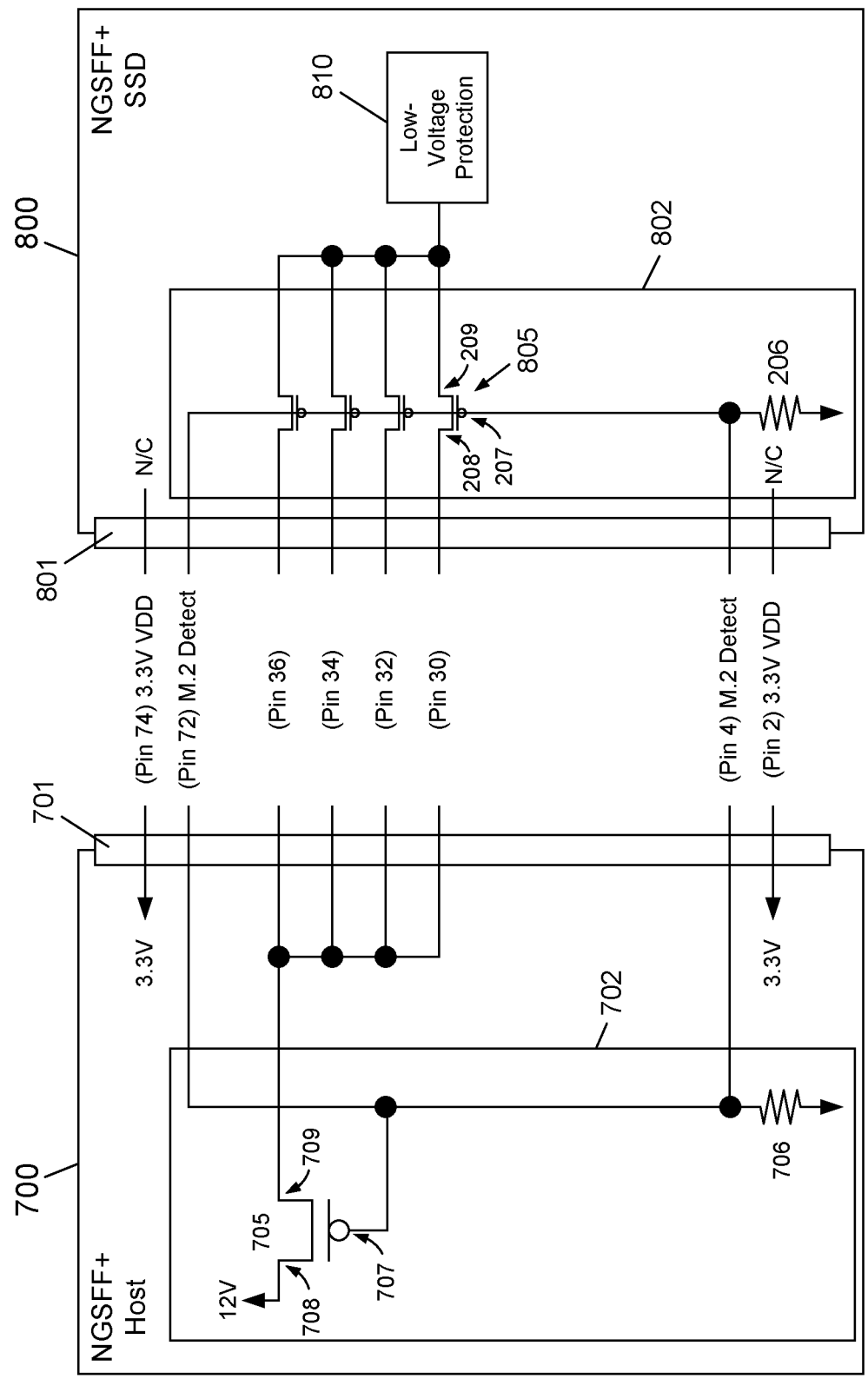
FIG. 9 depicts a schematic block diagram of the example embodiment of the host device in relationship to the example embodiment of the SSD device according to the subject matter disclosed herein.

FIG. 9 depicts a schematic block diagram of the example embodiment of the host device 700 in relationship to the example embodiment of the SSD device 800 according to the subject matter disclosed herein. As can be seen in FIG. 9, if the connector 801 of the SSD device 800 is connected to the connector 701 of the host device 700, the sensing devices 702 and 802 both sense or detect that the other device is compatible both electrically and functionally, so that, for example, power may be supplied through pins 30, 32, 34 and 36. In another embodiment, pins 30, 32, 34 and 36 of both the connectors 701 and 801 may be used to carry power, data and/or control signals depending upon the particular application or configuration of the NGSFF+ host device 700 and/or the NGSFF+ SSD device 800.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A device, comprising:
a first connector comprising at least one first-type pin and at least one second-type pin, the first connector capable of being connected to a corresponding connector of a solid-state drive (SSD) device; and
at least one first detector device coupled to the at least one first-type pin of the first connector, the at least one first detector device to control the at least one first-type pin to be coupled to a first power supply voltage to supply power to the SSD through the at least one first-type pin based on, at least in part, detecting that the at least one second-type pin is connected to a second power supply voltage in response to the corresponding connector of the SSD device being connected to the first connector, and to control the at least one first-type pin to be in a non-connected state based on, at least in part, detecting that the at least one second-type pin is connected to a third power supply voltage in response to the corresponding connector of the SSD device being connected to the first connector.

2. The device of claim 1, wherein the first connector comprises an M.2 form factor.

3. The device of claim 2, wherein the at least one first-type pin of the first connector comprises at least one of a pin 30, pin 32, pin 34 and pin 36 of the first connector.

4. The device of claim 2, wherein the at least one second-type pin of the first connector comprises at least one of pin 2, pin 4, pin 72 and pin 74 of the first connector.

5. The device of claim 2, wherein the first power supply voltage comprises 12 V, the second power supply voltage comprises ground, and the third power supply voltage comprises 3.3 V.

6. The device of claim 1, further comprising the SSD device, the SSD device comprising:
a second connector comprising at least one first-type pin and at least one second-type pin, the second connector capable of being connected to the first connector; and at least one second detector device coupled to the at least one first-type pin and the at least one second-type pin of the second connector, the at least one second detector device to control the at least one first-type pin of the second connector to be coupled to the first power supply voltage based on, at least in part, detecting that the at least one second-type pin of the second connector is connected to the second power supply voltage in response to the second connector being connected to the first connector, and to control the at least one first-type pin of the second connector to be in a non-connected state based on, at least in part, detecting that the at least one second-type pin of the second connector is connected to the third power supply voltage in response to the second connector being connected to the first connector.

7. The device of claim 6, wherein the second connector comprises an M.2 form factor.

8. The device of claim 7, wherein the at least one first-type pin of the second connector comprises at least one of a pin 30, pin 32, pin 34 and pin 36 of the second connector.

9. The device of claim 7, wherein the at least one second-type pin of the second connector comprises at least one of pin 2, pin 4, pin 72 and pin 74 of the second connector.

10. The device of claim 7, wherein the first power supply voltage comprises 12 V, the second power supply voltage comprises ground, and the third power supply voltage comprises 3.3 V.

11. A solid-state drive (SSD) device, comprising:
a first connector comprising at least one first-type pin and at least one second-type pin, the first connector capable of being connected to a corresponding connector of a host device; and
at least one first detector device coupled to the at least one first-type pin and the at least one second-type pin of the first connector, the at least one first detector device to control the at least one first-type pin of the first connector to be coupled to a first voltage based on, at least in part, detecting that the at least one second-type pin of the first connector is connected to a second voltage in response to the SSD being connected to the corresponding connector of the host device, the first voltage being provided by the host device, and to control the at least one first-type pin of the first connector to be in a non-connected state based on, at least in part, detecting that the at least one second-type pin of the first connector is connected to a third voltage in response to the first connector being connected to the corresponding connector of the host device.

12. The SSD device of claim 11, wherein the first connector comprises an M.2 form factor.

13. The SSD device of claim 12, wherein the at least one first-type pin of the first connector comprises at least one of a pin 30, pin 32, pin 34 and pin 36 of the first connector.

14. The SSD device of claim 12, wherein the at least one second-type pin of the first connector comprises at least one of pin 2, pin 4, pin 72 and pin 74 of the first connector.

15. The SSD device of claim 12, wherein the first voltage comprises 12 V, the second voltage comprises ground, and the third voltage comprises 3.3 V.

16. The SSD device of claim 11, further comprising the host device, the host device comprising:
a second connector comprising at least one first-type pin and at least one second-type pin, the second connector capable of being connected to the first connector; and
at least one second detector device coupled to the at least one first-type pin of the second connector, the at least one second detector device to control the at least one first-type pin of the second connector to be coupled to the first voltage based on, at least in part, detecting that the at least one second-type pin of the second connector is connected to the second voltage in response to the second connector being connected to the first connector, and to control the at least one first-type pin of the second connector to be in a non-connected state based on, at least in part, detecting that the at least one second-type pin of the second connector is connected to the third voltage in response to the second connector being connected to the first connector.

17. A solid-state drive (SSD) device, comprising:
a first connector comprising at least one first-type pin and at least one strap-signal-type pin, the first connector capable of being connected to a corresponding connector of a host device; and
at least one first detector device coupled to the at least one first-type pin and the at least one strap-signal-type pin of the first connector, the at least one detector device to control each first-type pin of the first connector to be coupled to a first voltage based on, at least in part, detecting that the at least one strap-signal-type pin of the first connector is connected to a second voltage in response to the first connector being connected to the corresponding connector of the host device, the first voltage being provided by the host device, and to control each first-type pin of the first connector to be in a non-connected state based on, at least in part, detecting that the at least one strap-signal-type pin of the first connector is connected to a third voltage in response to the first connector being connected to the corresponding connector of the host device.

18. The SSD device of claim 17, wherein the first connector comprises an M.2 form factor.

19. The SSD device of claim 18, wherein the at least one first-type pin of the first connector comprises at least one of a pin 30, pin 32, pin 34 and pin 36 of the first connector,
wherein the at least one strap-signal-type pin of the first connector comprises at least one of pin 2, pin 4, pin 72 and pin 74 of the first connector, and
wherein the first voltage comprises 12 V, the second voltage comprises ground, and the third voltage comprises 3.3 V.

20. The SSD device of claim 19, further comprising the host device, the host device comprising:
a second connector comprising at least one first-type pin and at least one strap-signal-type pin, the second connector capable of being connected to the first connector; and
at least one second control device coupled to the at least one first-type pin of the second connector, the at least one second control device to control each first-type pin of the second connector to be coupled to the first voltage based on, at least in part, detecting that the at least one strap-signal-type pin of the second connector is connected to the second voltage in response to the second connector being connected to the first connector, and to control each first-type pin of the second connector to be in a non-connected state based on, at least in part, detecting that the at least one strap-signal-type pin of the second connector is connected to the third voltage in response to the second connector being connected to the first connector.

\* \* \* \* \*